United States Patent [19]

Gratke

[11] Patent Number: 4,876,461

[45] Date of Patent: Oct. 24, 1989

[54] SELF-REFERENCING CAPACITIVE KEY CELL STRUCTURE AND SWITCHCORE MATRICES FORMED THEREFROM

[75] Inventor: Norman G. Gratke, Elm Grove, Wis.

[73] Assignee: W. H. Brady Co., Milwaukee, Wis.

[21] Appl. No.: 314,721

[22] Filed: Feb. 23, 1989

[51] Int. Cl.$^4$ .................. H03K 17/975; H01H 35/00
[52] U.S. Cl. ................................. 307/116; 200/600; 200/5 A; 341/33
[58] Field of Search ............... 200/5 A, 52 R, 600, 200/5 R; 361/287, 288; 307/112, 116; 341/22, 25, 33

[56] References Cited

U.S. PATENT DOCUMENTS

| | | | |
|---|---|---|---|
| 3,996,430 | 12/1976 | Eberwein et al. | 200/5 A |
| 4,233,522 | 11/1980 | Grummer et al. | 341/33 |
| 4,243,861 | 1/1981 | Strandwitz | 200/5 A X |
| 4,373,122 | 2/1983 | Frame | 200/600 |
| 4,373,124 | 2/1983 | Frame | 200/600 |
| 4,614,937 | 9/1986 | Poujois | 200/5 A X |
| 4,818,827 | 4/1989 | Ipcinski et al. | 200/5 A |

FOREIGN PATENT DOCUMENTS 176659  4/1986  European Pat. Off. ............ 200/600

*Primary Examiner*—J. R. Scott
*Attorney, Agent, or Firm*—Quarles & Brady

[57] ABSTRACT

In a capacitive switchcore of the type in which each key cell includes a contact switch in series with a key cell capacitor, an improvement is disclosed in which an intracell coactive loading capacitor is added to each key cell. The intracell coactive loading capacitor is connected between ground and the junction of the contact switch with the key cell capacitor. A matrix of key cells so formed is self-referencing, in that the need for a separate reference capacitor to load the sense line is eliminated. Instead, loading is provided intrinsically by the effect of the intracell coactive loading capacitors acting through multiple key cells connected to a sense line. A preferred embodiment in a capacitive membrane switchcore is described.

10 Claims, 4 Drawing Sheets

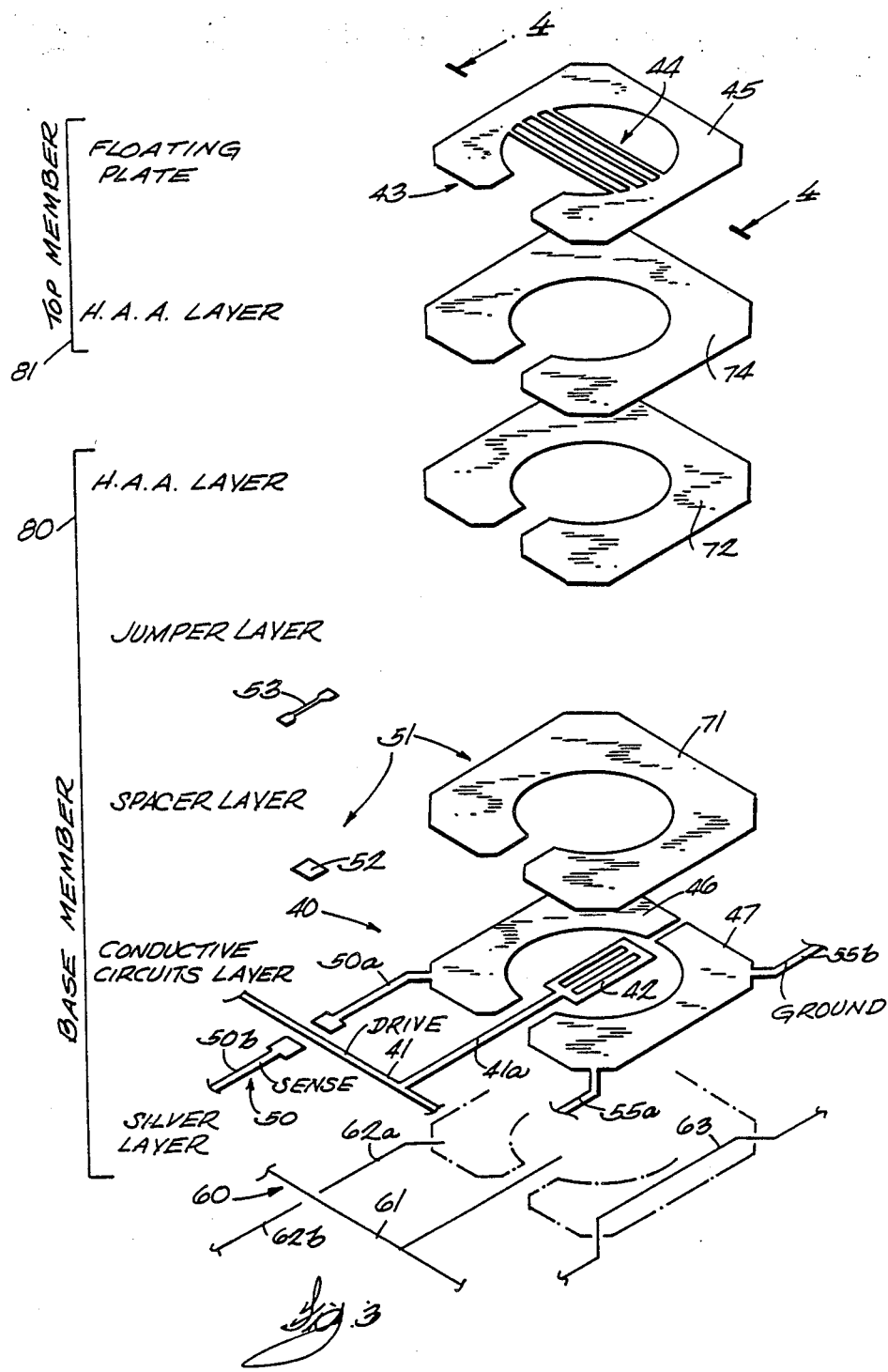

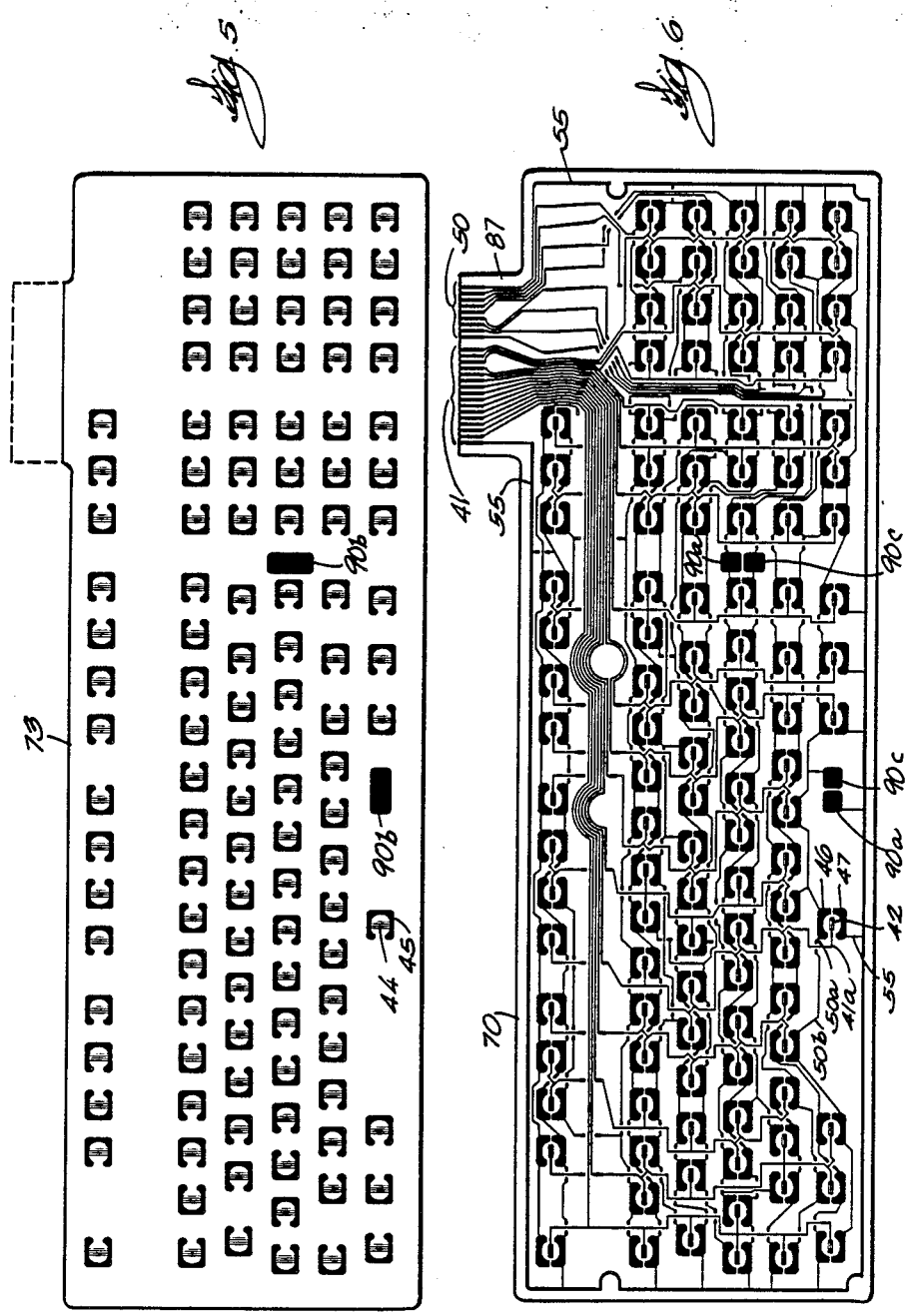

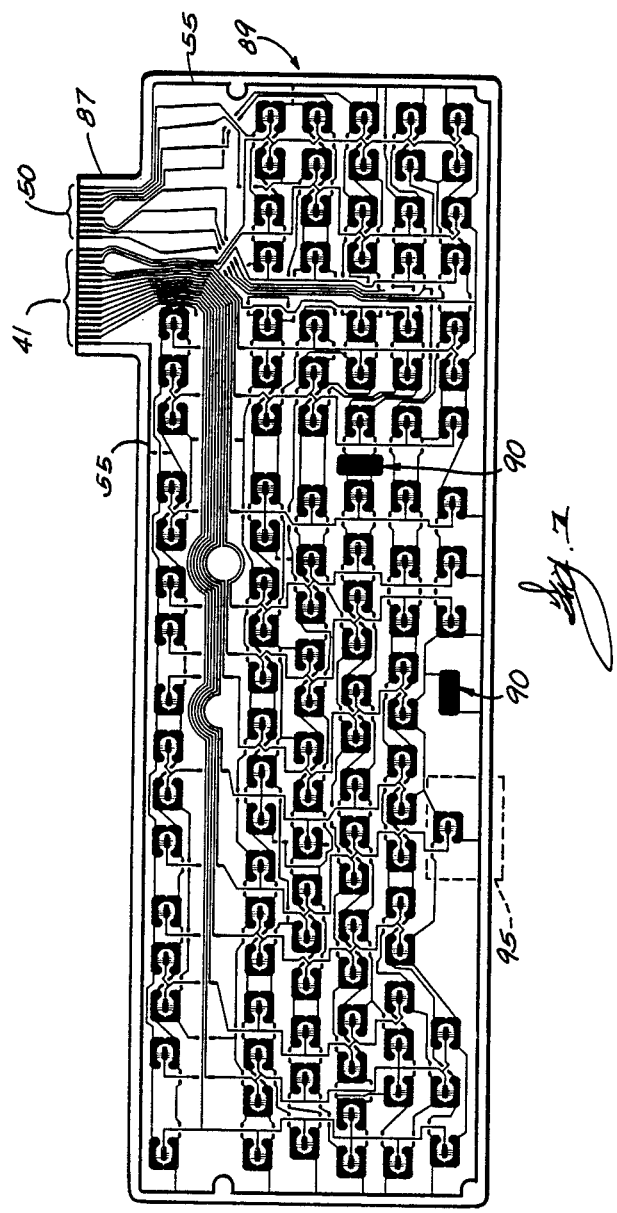

SELF-REFERENCING CAPACITIVE KEY CELL STRUCTURE AND SWITCHCORE MATRICES FORMED THEREFROM

This invention relates to capacitive switch cores of the type comprising a plurality of key cells with at least one capacitive element in each key cell, in which the net capacitance presented by the key cell changes upon key actuation. In one form, the key cell may comprise a variable, or moving plate, capacitor in order to provide the necessary capacitance variation. In another form, each key cell comprises a contact switch in series with a fixed capacitor. For the contact switch/fixed capacitor configuration, a high net capacitance is presented by the key cell when the switch is closed, and a low net capacitance is presented if the switch is open. In a matrix formed by a plurality of drive and sense lines, each key cell is connected across a unique drive line/sense line combination. The state of a key cell, i.e. open or closed, can then be determined by measurement of the net capacitance between selected drive and sense lines. In order to discriminate between the open and closed positions, it is necessary to "load" each sense line to which the key cells are connected, and this is usually accomplished with a "reference" capacitor.

This invention primarily relates to a new type of key cell structure which eliminates the need for the reference capacitors used in prior switchcore matrices, while at the same time providing increased signal margins for improved decoding capability. A capacitive key cell according to the invention includes a contact switch connected in series with a key cell capacitor, forming a floating junction at the series connection between the contact switch and the key cell. The key cell further includes an intracell coactive loading capacitor connected between a reference voltage and the floating junction. The addition of the intracell coactive loading capacitor is so named because of the interaction of the intracell coactive loading capacitor with the other key cell components, e.g. the contact switch and the fixed key cell capacitor. The result is a key cell structure in which multiple such key cells connected on the same sense line automatically provide mutual loading for a driven key cell on the sense line, thereby eliminating the need for a separate reference capacitor. Further, the maximum variation in the loading presented by the other key cells on the same sense line is reduced. Each key cell "loads" the sense line either with the fixed key cell capacitor, if the contact switch is closed, or with the series combination of the fixed key cell capacitor and intracell coactive loading capacitor, if the contact switch is open. Therefore, the state of the contact switch has a substantially reduced effect on the variation or change in parasitic key cell loading between contact switch states. The capacitance value of the intracell coactive loading capacitor may be approximately equal to the key cell capacitor, in order to provide a balance between open and closed worst case loading, thereby minimizing the variation in loading on the sense line between an "all key cell switches open" and an "all key cell switches closed" condition. The reference voltage connected to one end of the intracell coactive loading capacitor for loading purposes may comprise a dedicated conductor, or conductive trace, connected to ground potential and routed to every key cell in the matrix.

Another advantage of the intracell coactive loading capacitor is that it provides substantial attenuation for signals that would otherwise be conducted through the parasitic capacitance presented by an open contact switch. When the contact switch is open, an unavoidable parasitic capacitance exists between the switch contacts, which if not sufficiently loaded might be falsely decoded as a switch closure. Within a driven key cell, the intracell coactive loading capacitor acts to provide substantial loading for the parasitic capacitance of an open contact switch.

Another advantage of the invention is the ease with which it may be realized, at low cost, in a membrane switchcore. The membrane switchcore may comprise a stable layer and a flex layer laminated together, with conductive portions printed on the facing surfaces of both the stable and flex layers forming the key cells.

These and other features, objectives and advantages of the invention will be made apparent in the description which follows that sets forth a key cell incorporating the concepts of the invention and a matrix formed of a plurality of such key cells. The description is made by reference to the accompanying drawings, wherein:

FIG. 3 is an exploded perspective view of a membrane key cell constructed according to the key cell construction of FIG. 2;

FIG. 5 is a top plan view of a flex layer which incorporates the key cell structure of FIGS. 2-4;

FIG. 6 is a top plan view of a stable layer which incorporates the key cell structure of FIGS. 2-4; and FIG. 7 is a top plan view of the flex layer of FIG. 5 and the Stable layer of FIG. 6 superimposed on one another.

Figure 1:
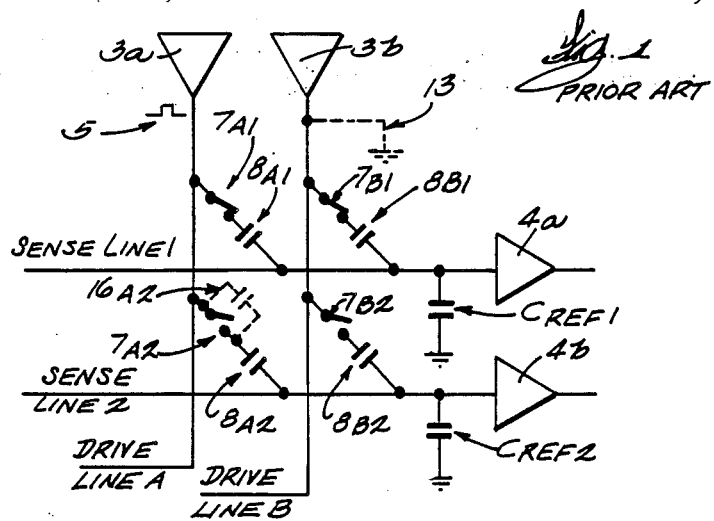
FIG. 1 is a schematic diagram of a prior art capacitive key cell matrix.

DESCRIPTION OF THE PREFERRED EMBODIMENTS (a) Detailed Description of Prior Art Capacitive Key Cells and Matrices Formed Therefrom, FIG. 1.

Capacitance type switchcores have the advantage over contact type switchcores in that the former is capable of detecting multiple simultaneous key depressions, known in the art as "N-Key rollover". When multiple keys are simultaneously depressed, "phantom" paths can be created to give the appearance of a key depression when that key is not actually depressed. In a contact switchcore, it is not possible to distinguish between a phantom path and a true closure because the contact switches when closed are very low impedance; a phantom path and a true path have essentially the same impedance. However, in a capacitance switchcore, each key cell includes a series capacitor which functions as a non-zero impedance element. Because of the series capacitor in each key cell, a technique known in the art as "ground guarding" can be used to eliminate the phantom paths. In ground guarding, all of the drive lines, other than the one drive line being actively driven, are held in a low impedance, logic low state, e.g. grounded. In that way, any potential phantom path is essentially shorted out.

However, with ground guarding the result of shorting out the phantom paths is that an additional, or parasitic, load is introduced on the sense lines of the switchcore. In prior switchcore matrices, the additional load may vary from essentially zero, if no key cells on a sense line other than the driven key cell are closed, to a maximum when all other key cells on a sense line are closed. Switchcores are decoded as a matrix, often formed with from eight to sixteen key cells attached to each sense line, so it can be seen that in prior art switchcore matrices the variation in load on a sense line when ground guarding is used can be substantial. Even with the variation in load on the primary signal from a driven key cell, it is still possible to select an appropriate threshold for the sense amplifier to successfully decode the switchcore, although in prior switchcores, the signal margins between worst case open and closed key cell conditions were small.

FIG. 1 illustrates an exemplary prior art capacitive key cell matrix, represented in the form of a two by two square matrix comprising sense lines 1 and 2 and drive lines A and B. Drive lines A and B are connected to drive amplifiers 3a and 3b, while sense lines 1 and 2 each terminate in a sense amplifier 4a and 4b, respectively. Each key cell includes a contact switch 7 and a fixed key cell capacitor 8, and is connected across a unique combination of one drive line and one sense line. For notational purposes herein, each key cell is referred to with the subscript of the particular drive and sense line combination across which the key cell is connected, e.g. A1, A2, B1, and B2. The extension of this simple two by two matrix to a multi-dimensional matrix should be apparent to those skilled in the art.

In operation, one of the drive amplifiers, in this example drive amplifier 3a, outputs an interrogating pulse, represented at numeral 5, in order to interrogate all of the key cells connected to that drive line. All other drive amplifiers in the matrix, in this case represented by drive amplifier 3b, are maintained at a constant potential of low impedance, e.g. effectively grounded, as indicated by dotted line 13. Although a "ground" is indicated for non-selected amplifiers in this example, it should be apparent to those skilled in the art that the non-selected amplifiers could equally be clamped to a voltage other than ground, for example, a logic high voltage, depending on the logic sense used.

In order to fully appreciate this invention, it is necessary to trace the progression of the interrogating pulse 5 through a capacitive key cell matrix as known in the prior art. Beginning from drive amplifier 3a, the interrogating pulse 5 proceeds to the first key cell located at the intersection of drive line A and sense line 1, e.g. key cell A1. At that point, the interrogating pulse 5 is applied to key cell A1, as it continues down drive line A to other key cells as described below.

Key cell A1 comprises a contact switch $7_{A1}$ in series with a fixed key cell capacitor $8_{A1}$. The switch $7_{A1}$ is presumed to be in the depressed or closed position to illustrate the means by which a closed switch indication is detected in prior capacitive key cell matrices. With the switch $7_{A1}$ closed, the interrogating pulse 5 is directly coupled from drive line A, through key cell switch $7_{A1}$, and through key cell capacitor $8_{A1}$ onto sense line 1. As will be explained in detail below, it is necessary to "load" sense line 1 to some extent to prevent false indications of key cell closure. The loading for sense line 1 can be resistive, but capacitive loading is currently preferred by those skilled in the art. Accordingly, a reference capacitor $C_{REF1}$ is connected to sense line 1 in order to provide a load for the pulse applied to sense line 1.

However, additional and undesirable loading is encountered due to other key cells also connected to sense line 1, in this example represented by key cell B1. Key cell B1 provides an additional load on sense line 1, via a path back through key cell capacitor $8_{B1}$ and key cell switch $7_{B1}$ to drive line B, which is effectively grounded at 13. Note that switch $7_{B1}$ is assumed in this example to be closed, since that condition represents the "worst case" loading for sense line 1 when trying to detect a closed switch condition on switch $7_{A1}$. It should also be appreciated by those skilled in the art that in a multidimensional matrix, many key cells may be connected to sense line 1, all of which would be assumed to be closed for the worst case condition, and therefore key cell B1 may be considered to represent the parallel combination of all such other key cells. In that way, the example of FIG. 1 is also illustrative of the general case of a multidimensional matrix.

As mentioned above, the interrogating pulse 5 propagates further down drive line A to key cell A2. Key cell A2 comprises a switch $7_{A2}$ and a key cell capacitor $8_{A2}$, in which the key cell switch $7_{A2}$ is assumed to be in the open position to illustrate the procedure used in prior art matrices for detecting an open key cell. Even though key cell switch $7_{A2}$ is open, an unavoidable, parasitic capacitance $16_{A2}$ is present in parallel with any such open switch. The parasitic switch capacitance $16_{A2}$ thereby provides an undesirable path for the interrogating pulse 5 through key cell capacitor $8_{A2}$ onto sense line 2.

The sense amplifiers 4a and 4b detect key cell closure by comparing the voltage level on their respective sense lines to a threshold voltage. In this case, the reference capacitor on sense lie 2, represented by $C_{REF2}$, must be of a sufficient size to prevent the false signal on sense line 2 caused by the open key cell switch capacitance from reaching the threshold for detection of a "closed" switch by sense amplifier 4b. Note that in detecting an "open" key cell condition, the worst case for loading purposes is to assume that all other key cells on sense line 2 have their switches, represented generally at $7_{B2}$, in the open position. While the non-selected key cells B2 provide some small amount of loading due to the parasitic open key cell capacitances (not shown) across the open switches $7_{B2}$, those effects have been ignored for the purposes of this worst case analysis.

As known by those skilled in the art, the sizing of the reference capacitors $C_{REF1}$ and $C_{REF2}$ is critical to the successful decoding of the matrix. The reference capacitors $C_{REF1}$ and $C_{REF2}$ must be made large enough to effectively swamp out false signals arising from open key cell switches, while at the same time being small enough to allow a sufficiently large voltage to be developed on the sense line for a closed key cell, taking into account the worst case loading of all other key cells on the sense line. Looking at it another way, each sense line "sees" a capacitive load which depends upon the number of non-driven key cells on that sense line which are in the closed position. The worst case for detecting an open key cell is that all of the other key cells on that sense line are open, e.g. minimum loading. In that case, the only load presented to the sense line is that of capacitor $C_{REF}$, or:

$$LOAD_{Open} = C_{REF}$$

Alternatively, the worst case for detecting a closed key cell condition is that all of the other key cells on the sense line are also closed, e.g. maximum loading. Then, the "load" seen by the sense line is effectively:

$$LOAD_{Closed} = C_{REF} + (N-1) * C_C$$

where:
N is the number of key cells on the sense line, and
$C_C$ is the value of each individual key cell capacitance.

In a typical matrix used, for example, in a large keyboard, as many as sixteen key cells may be connected to each drive line, so the load presented by those key cells may vary profoundly depending on the number of key cells open versus the number closed. The maximum variance in total load seen by the sense line between all key cells open versus all key cells closed may be expressed as the difference between the worst case open and closed conditions:

$$\text{MAX LOAD VARIANCE} = [C_{REF} + (N-1)*C_C] - C_{REF} = (N-1)*C_C$$

As a final note, it is known in the art that the reference capacitor $C_{REF}$ is usually a discrete element located remotely from the switchcore, or may be formed integrally on the switchcore, particularly with membrane type switchcores. It is further known that the reference capacitor $C_{REF}$ may actually comprise a plurality of smaller capacitances formed on the switchcore and distributed in parallel on the sense line, which for the purpose of this analysis has identically the same effect as the single lumped reference capacitor $C_{REF}$ as discussed above.

Figure 2:
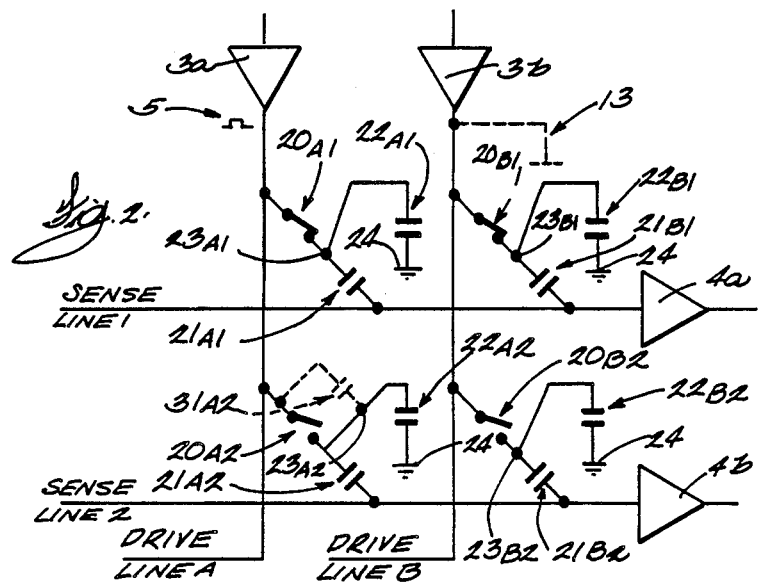
FIG. 2 is a schematic diagram of a capacitive key cell matrix according to the invention.

(b) Detailed Description of Capacitive Key Cells and Matrices Formed Therefrom According to the Invention, FIG. 2.

This part (b) describes a capacitive key cell matrix according to the invention, see FIG. 2, in which each key cell in the matrix includes an intracell coactive loading capacitor 22. The intracell coactive loading capacitor 22 is connected in each key cell between ground, or other constant voltage source, and a floating junction point 23 between key cell switch 20 and key cell capacitor 21. Junction point 23 is considered "floating" because it is isolated from d.c. currents when switch 20 is open, and therefore usually comprises a normally isolated conductive area on the switchcore.

As will be described in detail below, the operation of the intracell coactive loading capacitors 22 can reduce and even entirely eliminate the need for the reference capacitors $C_{REF}$ used in prior capacitive key cell matrices, while at the same time significantly reducing the variation in loading on the sense lines at the worst case extremes. By reducing the worst case variation of load capacitance, along with other effects such as, for example, additional loading of an open key cell switch within the key cell itself, this invention increases the worst case signal margins for discriminating between open and closed key cell states by a factor of two to three compared to prior switchcores. In addition, the switchcore of this invention is in essence a self-contained capacitive voltage divider matrix which provides a voltage output to the sensing circuitry, with the output voltage being substantially higher than the output voltage available in prior switchcores. This novel key cell structure, and its effect in decoding a capacitive key cell matrix is now described.

The matrix according to the invention in FIG. 2 includes the same drive amplifiers 3a and 3b, sense amplifiers 4a and 4b, sense lines 1 and 2, and drive lines A and B, as in the prior art example of FIG. 1. Also as in the prior art example, one of the drive amplifiers 3a produces an interrogating pulse 5, while the other drive amplifier 3b is clamped low, e.g. effectively grounded. The interrogating pulse 5 on drive line A is first applied to key cell location A1, connected across drive line A and sense line 1. As before, the interrogating pulse 5 continues on drive line A to other key cell locations which are described in detail below.

Key cell A1 comprises key cell switch $20_{A1}$, key cell capacitor $21_{A1}$, and intracell coactive loading capacitor $22_{A1}$. The key cell switch $20_{A1}$ is assumed to be in the closed position to illustrate the propagation of the interrogating pulse 5 through a closed key cell. When switch $20_{A1}$ is closed, it presents a relatively low impedance path for the interrogating pulse 5 through the switch $20_{A1}$ to point $23_{A1}$. Point $23_{A1}$ is a junction which connects to one terminal of key cell switch $20_{A1}$, one terminal of key cell capacitor $21_{A1}$, and to one terminal of intracell coactive loading capacitor $22_{A1}$. The opposite terminal of intracell coactive loading capacitor $22_{A1}$ is connected to a dedicated ground line 24 which is run to each key cell throughout the matrix. The opposite end of key cell capacitor $21_{A1}$ is connected to sense line 1.

At this point, it should be noted that the intracell coactive loading capacitor $22_{A1}$ has a negligible effect on loading the key cell in which it is contained when the key cell switch is in the closed position. Intracell coactive loading capacitor $22_{A1}$ is charged directly by drive amplifier 3a through the relatively low resistance of closed key cell switch $20_{A1}$. At the same time, the voltage, or signal, at the junction point 23 is applied to the key cell capacitor 21. In other words, the two capacitors 21 and 22 are driven in parallel, and not in a "loading" relationship. Therefore, the interrogating pulse 5 propagates through the key cell capacitor $21_{A1}$ onto sense line 1 without substantial attenuation.

A novel feature of this invention is that the entire loading for each sense line, for example sense line 1, is provided by the other key cells attached to that sense line; no reference capacitor, or direct loading of the sense line to ground is necessary. In the present example of detecting a closed key cell on sense line 1, loading is provided by key cell B1, connected between sense line 1 and the grounded drive line B. The loading path for sense line 1 is through key cell capacitor $21_{B1}$ to junction $23_{B1}$. As before, the worst case for detecting a closed key cell is maximal loading on sense line 1, which occurs with key cell switch $20_{B1}$ in the closed position. In that case, there is a direct path from point $23_{B1}$ through key cell switch $20_{B1}$ to the virtual ground 13 provided by drive amplifier 3b. As will be described in detail below, an alternate loading path from junction point $23_{B1}$ is through intracell coactive loading capacitor $22_{B1}$, but in the present example with key cell switch $20_{B1}$ closed, that alternate loading is negligible.

The interrogating pulse 5 on drive line A is also applied to key cell A2, where a key cell of the present invention is represented in the open position. In that case, an open key cell capacitance $31_{A2}$ is unavoidably realized across the key cell switch $20_{A2}$. Open key cell capacitance $31_{A2}$ provides a path for the interrogating pulse 5 to the junction point $23_{A2}$. Now, however, instead of junction point $23_{A2}$ being driven by a low impedance connection to drive amplifier 3a, it is instead driven through the relatively high impedance of the parasitic key cell capacitance $31_{A2}$. As a result, substantial loading is provided by intracell coactive loading capacitor $22_{A2}$ to ground connection 24. As will be pointed out below, a preferred size for the intracell coactive loading capacitor is approximately equal to the key cell capacitor, in which case the attenuation provided is at least one half, depending on the loading on the sense line.

The attenuated signal at junction point $23_{A2}$ then propagates through key cell capacitor $21_{A2}$ onto sense line 2. Further loading is then provided by the other key cells connected on sense line 2, represented by key cell B2. Specifically, the loading path for sense line 2 is through key cell capacitor $21_{B2}$ to junction point $23_{B2}$, and through intracell coactive loading capacitor $22_{B2}$ to ground 24. In the present case of detecting an open key cell condition, the worst case is minimal loading and so key cell switch $20_{B2}$ is assumed to be open and the capacitive effects thereof are ignored. It is important to note, however, that even with the key cell switch 20 open, substantial loading is still provided through the action of the intracell coactive loading capacitor $22_{B2}$. Note further that the intracell coactive loading capacitor $22_{B2}$ does not itself directly load the sense line, but rather acts in concert with the key cell capacitor 21 to provide the load, hence the descriptor "coactive". The "coactive" nature of the intracell coactive loading capacitor is further exemplified by its effect in cooperating with the open key cell capacitance to attenuate the interrogating pulse in that instance, and by the effect of essentially being "switched out" of the loading path when the key cell switch is closed.

It should now be apparent that the key cell structure according to this invention is particularly effective at damping signals coupled by the stray capacitance of open key cell switches. This greatly facilitates the design of capacitive keyboard matrices for two reasons. First, much higher values of open key cell capacitance can be tolerated due to the greater degree of loading on the open key cell condition. And secondly, it can be seen that the maximum variation in sense line loading is much narrower than in the above described prior art example. Specifically, maximal loading is provided when all the key cell switches 20 on a given sense line are all simultaneously closed in which case the load provided is essentially:

$$LOAD_{Closed} = (N-1) * C_C$$

where: $C_C$ is the capacitance of the key cell capacitor 21, and N is the number of key cell switches on the sense line.

The minimum loading is realized with all key cell switches 20 on a common sense line in the open position, in which case the loading is equal to:

$$LOAD_{Open} = (N-1) * C_S$$

where: $C_S$ is the net capacitance of the key cell capacitor 21 in series with the intracell coactive loading capacitor 22.

The maximum variation between the worst case conditions, e.g. all switches open and all switches closed, can further be minimized by preferably selecting the value of the intracell coactive loading capacitors 22 to be approximately the same value as the key cell capacitor 21, $C_C$. Then, $C_S$ is approximately equal to $C_C/2$, and the maximum loading variance can be expressed as:

$$\begin{aligned}\text{MAX LOAD VARIANCE} &= [(N-1) * C_C] - \left[(N-1) * \frac{C_C}{2}\right] \\ &= \frac{(N-1) * C_C}{2}\end{aligned}$$

An important result of the invention is emphasized by comparing the above equation to the result obtained for the MAX LOAD VARIANCE for the Prior Art capacitive key cell matrix described in part (a) above. Specifically, the maximum load variance for a capacitive key cell matrix of the invention is shown to be half of that obtainable in prior capacitive key cell matrices. The practical effect of this improvement in worst case load variance is that there is a much greater spread, or difference, between the voltages on the sense line corresponding to open and closed key cell conditions.

As discussed above, voltages on the sense line are developed by a capacitive voltage divider action. For example, assuming a typical condition of sixteen drive lines and an open to closed key cell capacitance ratio of about 1:5, a prior art capacitance switchcore with an optimally sized reference capacitor produces output voltages on the sense line on the order of 50 millivolts (mV) for an open key cell and 200 mV for a closed key cell. Under similar conditions, using intracell coactive loading capacitors according to the invention instead of reference capacitors, output voltages of 40 mV and 300 mV are attainable for open and closed key cells, respectively. It should be apparent that the greater difference between open and closed output voltages afforded by this invention is highly beneficial in providing greater immunity to noise and variations in component values, for example, due to manufacturing tolerances.

Figure 4:
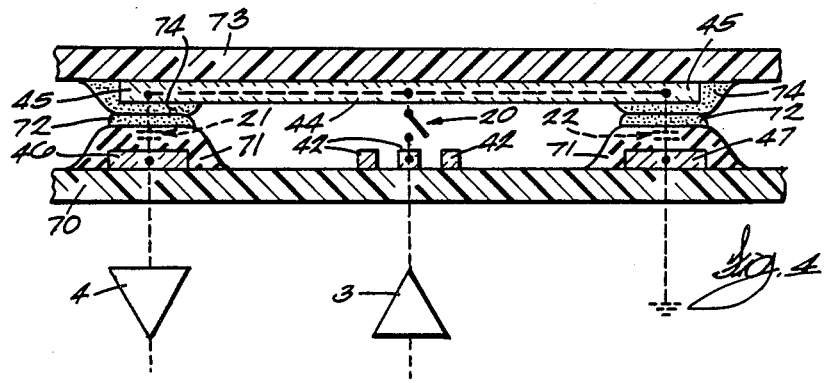
FIG. 4 is a sectional view taken on line 4—4 of FIG. 3.

(c) Construction of Cells, FIGS. 3 and 4

Referring to FIG. 3, a presently preferred structure for implementing the key cell of the invention as described above in relation to FIG. 2 is now described. All conductive traces for the drive lines 41, sense lines 50, and ground lines 55 are formed by screen printing a conductive ink onto a suitable substrate 70 of flexible plastic film (not visible in FIG. 3). The circuits 41, 50 and 55 are therefore all coplanar, on a level identified in FIG. 3 as the conductive circuits layer 40.

As will be appreciated by those skilled in the art, the layout of drive, sense and ground lines all on the same level requires many intersections at which conductive traces must cross each other without shorting together, e.g. must be bridged. The preferred method for forming those bridges is by the use of "printed cross-overs", a method which is generally known in the art. An insulating pad 52 is printed over the conductor to be bridged as part of a spacer layer 51, and a jumper 53 is printed to establish connection across the bridged conductor. As illustrated in FIG. 3, sense line 50 comprises branch traces 50a and 50b, which are bridged by jumper 53 while insulating pad 52 prevents shorting to drive line 41.

As for the structure of the key cell itself, a branch trace 41a extending from drive line 41 is routed to a central region of the key cell where there is formed a series of parallel spaced conductive traces 42. The conductive traces 42 comprise one pole of the key cell switch 20 as shown in FIG. 2. A floating plate 43, corresponding to the floating junction 23 of FIG. 2, is screen printed on a facing surface of a top layer of flexible plastic film, referred to herein as the top film 73 (not shown in FIG. 3). The floating plate 43 comprises a "horseshoe" shaped plate, or conductive area 45, and a series of parallel conductive traces 44 connecting opposite arms of the conductive area 45. The parallel conductive traces 44 are placed at a right angle with respect to conductive traces 42, and comprise the other pole of key cell switch 20.

Substrate 70 and top film 73 can be made of any non-conductive flexible plastic film suitable for membrane switchcore constructions. Polyester films, such as polyethylene terephthalate films, are the most commonly used materials, although polycarbonate films, polyimide films, polysulfone films, polyolefin films and unplasticized polyvinyl chloride films also can be used. The films can be in the range of about 0.001 to 0.0015 inches thick, or thicker if so desired. In general, a substrate film about 0.005 inches thick is appropriate to provide a stable lower layer of the switchcore construction, and top film 73 can be thinner so as to provide a flexible layer that can be easily deflected or flexed downward upon actuation of a selected key cell.

As will be described below, the top film 73 is separated from the substrate 70 by several insulating layers such that the conductive traces 44 are normally not in contact with conductive traces 42, hence the terminology "floating". Upon application of pressure to the top film 73, however, the conductive traces 44 are deflected downward to make contact with the conductive traces 42 thereby closing the key cell switch 20, and forming a conductive path from drive line 41 to the conductive area 45. The conductive area 45 therefore functions as one plate, e.g. the upper plate, of both the key cell capacitor 21 and the intracell coactive loading capacitor 22.

Underneath the conductive area 45, separate capacitor plates 46 and 47 are positioned so as to complete the formation of the key cell capacitor 21 and the intracell coactive loading capacitor 22, respectively. Plate 46 of the key cell capacitor 21 connects to sense line 50, while plate 47 of the intracell coactive loading capacitor 22 connects to ground line 55. Ground line 55 is distributed to every key cell in the matrix, and is shown in FIG. 3 as being routed through the conductive area of plate 47 via branch traces 55a and 55b. Plates 46 and 47 are formed as part of the conductive circuits layer 40 and are coplanar with circuits 41, 50, and 55.

The physical construction and assembly of the key cell is as follows. As will be described below, a plurality of key cells are preferably formed as a membrane switchcore. Initially, two sub-assemblies of the membrane switchcore are prepared separately, a base member 80 including substrate 70, conductive circuits layer 40 and spacer layer 51 and a top member 81 including top film 73 and floating plates 43. To prepare the base member 80, a silver layer 60 may first be applied to a substrate 70, to be overprinted by the conductive circuits layer 40. Up to this point, the effects of trace resistance have not been addressed. Because of the preferred method of capacitive loading, the output voltages are developed by capacitive voltage dividers which are for the most part independent of trace resistance. However, this assumes that a period of time is allowed for the drive pulse to fully charge the capacitive voltage divider network. The effect of trace resistance is that high trace resistance results in a greater capacitor charging time constant, and therefore a longer sampling period. The conductive circuits layer 40 is preferably printed using a carbon based conductive ink, which is inexpensive but has a fairly high resistivity. The silver layer 60 may be used to lower the trace resistances, thereby providing for higher speed decoding.

The silver layer 60 comprises very thin traces of a silver based ink which are underprinted under selected trace portions of the circuits on the conductive circuits layer 40 for the purpose of providing a low impedance path for the selected traces. As shown in FIG. 3, trace 61 of the silver layer 60 underlies drive line 41, while traces 62a and 62b underlie sense line traces 50a and 50b, and trace 63 is routed under ground line trace 55a, across plate 47, and under trace 55b. An outline of plates 46 and 47 is shown in phantom on the silver layer 60 as a perspective reference for the positioning of traces 61–63 of the silver layer 60. Although the various conductive elements such as drive lines 41, sense lines 50, ground lines 55, traces 42, floating plates 43 and capacitor plates 46 and 47 have been described above as being screen printed with conductive inks, these circuit components can also be formed by other techniques such as vacuum deposition of conductive metals such as silver, gold, aluminum or copper onto the surface of the respective plastic film layers, as well as by etching or plating techniques. Also, carbon based inks and silver based inks have been described above, but other conductive inks can be used such as those containing gold, copper, graphite or other metal powders dispersed in a suitable binder, as well as mixtures of two or more conductive metallic powders, and many suitable conductive inks are known in the art and commercially available.

The conductive circuits layer 40 is printed after the silver layer 60, when used, has been printed on the substrate 70. The spacer layer 51 is printed on top of the conductive circuits layer 40. The spacer layer 51 comprises printable insulting material as is well known in the art, and is preferably formed using a double printing pass to provide a thicker and more reliable insulation. Thus, the spacer layer 51 can be formed of a coating applied in liquid form and cured to form a hardened layer. Many compositions are suitable for a coating of this type and include UV curable coatings of an acrylate-epoxy resin or a blend of vinyl and acrylate esters, solvent coatings of similar polymers or copolymers, and epoxy coatings such as a bisphenol A-epichlorohydrin epoxy coating. Also, however, spacer layer 51 can be formed of a thin nonconductive plastic film of the type used for the substrate layer 70 and top film 73 that is diecut in the appropriate pattern. The spacer layer 51 includes insulating pads 52, as described above, used in forming the printed cross over connections. The spacer layer 51 also includes large insulated areas 71 which overlie and comprise part of the dielectric separating capacitor plates 46 and 47 from the upper plate 45. The remainder of the dielectric is provided by heat activated adhesive layers 72 and 74 described below. The insulating area 71 is slightly oversized with respect to the plates 46 and 47 to insure complete coverage.

An important advantage of the key cell structure according to the invention is that it greatly facilitates the use of printed dielectric materials, as opposed to films or other dielectrics, in forming the capacitive switchcore. The manufacturing tolerances of printed dielectrics are difficult to control, particularly the thickness of the printed layers. Because of the increased signal margins provided by this invention, a substantially improved immunity to those manufacturing tolerances is provided. In other words, the effect of larger manufacturing tolerances is essentially a reduction in signal margin, or the ability to discriminate between an open and a closed key cell. Therefore, some of the additional signal margin provided by this invention can be lost due to manufacturing tolerances, for example, by using printed dielectrics, without compromising decodability.

In addition, the particular structure shown in FIG. 3 is especially efficient, as the single spacer layer fulfills the multiple functions of: (1) providing an insulator for the jumpers, (2) providing a dielectric for the key cell and intracell coactive loading capacitors, (3) providing separation for the switch contacts, and (4) providing a vent path for the key cell switch area.

The next layer above the spacer layer 51 is the jumper layer, which includes the conductive jumpers 53 needed to complete the printed cross over connections. In consonance with the above discussion of trace resistance, the jumpers 53 may be formed from either a carbon based ink, or a silver based ink, the latter providing lower overall impedance for the respective traces and therefore higher speed decoding.

After the jumper layer, a layer of heat activated adhesive (H.A.A) is printed in a pattern which defines the areas on the base member 80 which are to be adhered to the top member 81 after assembly. This may include such areas, for example, as the periphery of the switchcore and a connector tail area (not shown), but in particular it is preferred to adhere the conductive area 45 to the insulating area 71, and so a pattern of heat activated adhesive 72 roughly corresponding to the shape of insulating area 71 is applied as the last layer of the base member 80.

On the top member 81, the floating plate 43 is first printed onto top film 73. Over the floating plate 43, another layer of heat activated adhesive is applied in areas 74 which correspond to the areas on the base member 80 also containing heat activated adhesive, in particular each conductive area 45. After the top member 81 is prepared, it is positioned so that the heat activated adhesive portions on the top and base members 81 and 80, respectively, are facing each other. The top and base members 81 and 80, respectively, are then laminated together with sufficient heat and pressure to activate the heat activated adhesive layers insuring a strong physical bond between them. Vent openings are provided in the membrane so that flexure of the key cells does not pressurize the interior of the membrane, and also to prevent changes in atmospheric pressure from causing flexure of the membrane. Other nonconductive adhesives can be used in lieu of heat activated adhesive as described above, including pressure sensitive adhesives, thermosetting adhesives and ultraviolet curable adhesives; many suitable adhesives are well known in the art, and a particular adhesive should be selected with regard to the specific types of film materials to be joined together.

FIG. 4 shows a sectional view of a key cell when assembled as described above. In this view, the electrical relationship among the various elements is shown schematically in dotted lines. A drive amplifier 3 applies a drive signal to lower contact conductive traces 42. The upper conductive traces 44 are normally separated therefrom, and may be deflected downward to "close" the switch 20. The upper conductive traces 44 are integral with the conductive area 45 which forms the upper plate of both key cell capacitor 21 and intracell coactive loading capacitor 22. Bottom plate 46 of key cell capacitor 21 connects to a sense amplifier 4, while bottom plate 47 of intracell coactive loading capacitor 22 connects directly to ground. As stated previously, the key cell capacitor 21 and intracell coactive loading capacitor 22 are preferably the same value, each comprising an area of approximately 0.05 to 0.1 in$^2$ (32 to 64 mm$^2$) and a separation of 0.0015 to 0.0025 inches (b 0.038 to 0.063 mm) between plates to yield an approximate capacitance value of 25 pF.

(d) Matrix of Key cells Embodied in a Membrane Switchcore, FIGS. 5-7.

FIGS. 5-7 illustrate a full alpha-numeric capacitive membrane switchcore which incorporates a plurality of the key cells as described in part (c) above. In particular, FIGS. 5 and 6 show partial assemblies comprising the floating plates 43 and conductive circuits layer 40 as they would appear on top film 73 and substrate 70, respectively. The jumper, silver, spacer, and heat activated adhesive layers have been omitted for clarity, as their placement and function will be apparent from the key cell illustrated in FIG. 4. In FIG. 6, the routing of all traces for drive lines 41 and sense lines 50, along with the cross-over points to be "jumpered", are clearly evident. In FIG. 5, however, it is important to note that the top film 73 is completely devoid of traces. As a result, all drive and sense lines, 41 and 50, respectively, terminate on the same side of a single tail portion 87. In FIG. 5, the location of the tail is shown in phantom for reference only; the top film 73 does not cover the tail 87, rendering the contact areas accessible.

Ground line 55 extends along both the right and left sides of the tail 87, and encircles the entire periphery of the switchcore. Tributaries from the ground line 55 branch out to provide a ground connection for the intracell coactive loading capacitor 22 in each key cell. This configuration provides a good, low impedance ground path which is easily routed to all key cells in the switchcore.

As an exemplary illustration, one of the key cells of FIGS. 5 and 6 has been labeled with the reference numbers used to identify the key cell components illustrated in FIGS. 3 and 4. In FIG. 7, the floating plate and conductive circuits layers are shown superimposed on one another as they would appear in an assembled switchcore 89, with the selected key cell indicated by box 95. The crossed traces 42 and 44 at the center of each key cell comprising the key cell switch can be clearly seen. Again, the silver, jumper, spacer, and heat activated adhesive layers have been omitted for clarity. The spacer and heat activated adhesive layers, in addition to being applied at each key cell as shown in FIG. 4, are preferably applied in a wide band around the periphery of the switchcore, except for narrow gaps to allow internal venting as described above. It should be understood by those skilled in the art that a switchcore so constructed is known as "sealed" in that the key cell switches 20 are activated internally, with the entire switchcore being environmentally protected.

As discussed above, a switchcore utilizing a capacitive key cell matrix of the invention is self-referencing in that each sense line is intrinsically loaded by the action of the intracell coactive loading capacitors 22. As such, it is preferred that each sense line have the same number of key cells attached to it, merely so that all sense lines have the same maximum and minimum loading (all key cells open or all key cells closed). This simplifies sense amplifier design by allowing all sense amplifiers to be identical, and in fact allows a single sense amplifier to be used through an analog multiplexer. If the physical layout is such that the key cells can not be divided evenly among the sense lines, then some sense lines will have a fewer number of key cells attached. In that case, "dummy" key cells can be added to the deficient sense lines to simulate the capacitive load of an "open" key cell. The dummy key cells may therefore simply be a capacitor sized to simulate the number of missing actual key cells on the sense line. The switchcore shown in FIGS. 5-7 illustrates this principle, with dummy key cells 90 connected to two sense lines with fewer actual key cells than the rest of the sense lines. Each dummy cell actually comprises three plates 90a-90c. Plate 90a is connected to ground line 55, while plate 90c is connected to one to the sense lines 50. Plate 90b is floating, or isolated, and overlies both plates 90a and 90c, thereby providing the desired capacitive loading.

It should be apparent to those skilled in the art that the application of this invention, e.g. a key cell including an intracell coactive loading capacitor, in other specific switchcore designs may selectively employ the teachings set out above either in whole or in part. Thus, the foregoing enabling description of this invention sets forth an exemplary construction of a membrane switchcore incorporating the concepts of my invention, but it will be apparent to those of ordinary skill in the art that the exemplary embodiments can be modified in various ways and yet result in a switchcore within the scope of this invention; it is therefore intended that the appended claims encompass all modifications of the disclosed embodiments that are within the true spirit and scope of the invention.

I claim:

1. In a capacitive key cell of the type including a contact switch in series with a key cell capacitor for use in a matrix of similar capacitive key cells, the improvement wherein each key cell further includes an intracell coactive loading capacitor connected between a low impedance source of constant voltage and the junction of the contact switch with the key cell capacitor.

2. The improvement of claim 1 in which the value of the intracell coactive loading capacitor is approximately equal to the key cell capacitor.

3. The improvement of claim 1 in which the low impedance source of constant voltage is a conductor connected to ground potential, and the conductor is routed to ever key cell in the matrix.

4. The improvement of claim 1 in which the matrix is formed as a membrane switchcore.

5. The improvement of claim 4 in which the membrane switchcore comprises a base member and a top member laminated together, with conductive portions printed on the facing surfaces of both the base and top members forming the key cells.

6. A membrane switchcore comprising:
a plurality of drive lines;
one or more sense lines;
a ground line;
a plurality of key cells, each key cell being connected to the ground line and to a unique combination of one drive line and one sense line, in which at least one sense line is connected to two or more of said plurality of key cells, and in which each key cell includes: a contact switch, with one end of the contact
switch being connected to one drive line, and the other end of the contact switch being connected to a floating junction point, the contact switch having a high impedance open state and a low impedance closed state;
actuating means for changing the contact switch between the open and closed states;
a key cell capacitor, with one end of the key cell capacitor being connected to said at least one sense line, and the other end of the key cell capacitor being connected to the floating junction point; and
an intracell coactive loading capacitor connected between the floating junction point and the ground line;
wherein when an interrogating pulse is applied to one of the drive lines connected to a first key cell on said at least one sense line, the remainder of the key cells on said at least one sense line, other than the first key cell, provide substantial loading for said at least one sense line, regardless of the state of the contact switches in said remainder of key cells.

7. The membrane switchcore as recited in claim 6 in which if the contact switch in the first key cell is in the open state, then a stray capacitance exists across the open key cell contact switch which conducts the interrogating pulse from the drive line to the floating junction point, and the intracell coactive loading capacitor in the first keycell provides substantial attenuation of the interrogating pulse a the floating junction point.

8. The membrane switchcore as recited in claim 6 in which (1) each key cell includes (i) a first plate of the key cell capacitor, a first plate of the intracell coactive loading capacitor, and a first contact of the contact switch formed on a first surface of a first film, (ii) a second plate of the key cell capacitor, a second plate of the intracell coactive loading capacitor, and a second contact of the contact switch formed on a second surface of a second film which faces the first surface of the first film, and (2) one of the first or second films is flexible, and (3) the first and second surfaces are separated by a dielectric, the dielectric containing an aperture at the site of each contact switch to allow said flexible film to be flexed through the aperture to establish ohmic contact between said first and second contacts.

9. The membrane switchcore as recited in claim 8 in which the first contact of the key cell capacitor is connected to a drive line, the first plate of the key cell capacitor is connected to a sense line, and the first plate of the intracell coactive loading capacitor is connected to the ground line; and in which the second plate of the key cell capacitor, the second plate of the intracell coactive loading capacitor, and the second contact of the key cell switch are all formed as a single common conductive area on the second surface of the second film, said single common conductive area comprising the floating junction point.

10. The membrane switchcore as recited in claim 8 in which the dielectric is screen printed onto one of the first or second surfaces.

* * * * *